United States Patent
Kim et al.

(10) Patent No.: US 9,697,764 B2
(45) Date of Patent: Jul. 4, 2017

(54) DISPLAY DEVICE HAVING BENT DISPLAY AREA FOR REDUCED BEZEL WIDTH

(71) Applicant: LG Display Co., Ltd., Seoul (KR)

(72) Inventors: Changnam Kim, Paju-si (KR); Jaeyoung Lee, Daejeon (KR); Yoonheung Tak, Goyang-si (KR); Wonjae Yang, Gimpo-si (KR); Doyoul Kim, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 3 days.

(21) Appl. No.: 13/926,741

(22) Filed: Jun. 25, 2013

(65) Prior Publication Data

US 2014/0132488 A1    May 15, 2014

(30) Foreign Application Priority Data

Nov. 14, 2012    (KR) ........................ 10-2012-0129152

(51) Int. Cl.
*G09G 3/30* (2006.01)
*G06F 1/16* (2006.01)
(Continued)

(52) U.S. Cl.
CPC ............. *G09G 3/30* (2013.01); *G06F 1/1626* (2013.01); *G06F 1/1637* (2013.01);
(Continued)

(58) Field of Classification Search
CPC .................................................. G09G 2380/02
See application file for complete search history.

(56) References Cited

U.S. PATENT DOCUMENTS

2007/0216670 A1* 9/2007 Yatsu et al. .................... 345/205
2010/0171683 A1* 7/2010 Huitema et al. ................ 345/55
(Continued)

FOREIGN PATENT DOCUMENTS

CN     101943965 A    1/2011
CN     101996535 A    3/2011
(Continued)

OTHER PUBLICATIONS

European Patent Office, Search Report and Opinion, European Patent Application No. 13188854.7, Feb. 28, 2014, ten pages.
(Continued)

*Primary Examiner* — Alexander Eisen
*Assistant Examiner* — Kebede Teshome
(74) *Attorney, Agent, or Firm* — Fenwick & West LLP

(57) ABSTRACT

The present disclosure relates to a display panel having a structure in which the left and right lateral side bezel areas are bent downward to reduce the width of bezel area visible to a user. The display device includes a transparent cover plate and a flexible display layer secured to the transparent cover plate. The transparent cover includes a flat portion. The flexible display layer includes a display area and a non-display area. The display area includes an upper flat area extending along a first plane below the flat portion of the transparent cover plate. The non-display area extends from at least an edge of the display area and at least part of the non-display area extends along a second plane for connection to receive a signal for displaying an image on the flexible display layer. A signal line between a signal source and the non-display area transmit the signal from the signal source to the non-display area.

14 Claims, 6 Drawing Sheets

(51) Int. Cl.
*H04M 1/02* (2006.01)
*H01L 51/52* (2006.01)
*H01L 27/32* (2006.01)

(52) U.S. Cl.
CPC ........ *G06F 1/1652* (2013.01); *H01L 27/3276* (2013.01); *H01L 51/52* (2013.01); *H01L 51/5237* (2013.01); *H04M 1/0268* (2013.01); *H01L 2251/5338* (2013.01)

(56) References Cited

U.S. PATENT DOCUMENTS

| | | | | |
|---|---|---|---|---|
| 2011/0007042 | A1* | 1/2011 | Miyaguchi | 345/204 |
| 2011/0050657 | A1 | 3/2011 | Yamada | |
| 2011/0285607 | A1* | 11/2011 | Kim | 345/1.3 |
| 2012/0107978 | A1 | 5/2012 | Shin et al. | |
| 2013/0002133 | A1* | 1/2013 | Jin et al. | 313/511 |
| 2013/0076649 | A1* | 3/2013 | Myers et al. | 345/173 |
| 2014/0002385 | A1* | 1/2014 | Ka et al. | 345/173 |
| 2014/0098034 | A1* | 4/2014 | Hack | G06F 1/1677 345/173 |
| 2015/0212548 | A1* | 7/2015 | Namkung | G06F 1/1652 345/174 |

FOREIGN PATENT DOCUMENTS

| | | |
|---|---|---|
| EP | 2 456 175 A1 | 5/2012 |
| EP | 2 541 371 A2 | 1/2013 |
| JP | 2011-047977 A | 3/2011 |
| KR | 10-2010-0119620 A | 11/2010 |
| KR | 10-2012-0061496 A | 6/2012 |
| KR | 10-2012-0091871 A | 8/2012 |

OTHER PUBLICATIONS

Korean Intellectual Property Office, Office Action, Korean Patent Application No. 10-2012-0129152, Dec. 22, 2014, five pages [with concise explanation of relevance in English].
Chinese First Office Action, Chinese Application No. 201310401766.6, Aug. 13, 2015, 16 pages.
Korean Office Action, Korean Application No. 10-2012-0129152, Jun. 29, 2015, 6 pages (with concise explanation of relevance).

* cited by examiner

DISPLAY DEVICE HAVING BENT DISPLAY AREA FOR REDUCED BEZEL WIDTH

CROSS-REFERENCE TO RELATED APPLICATION

This application claims the benefit of Korean Patent Application No. 10-2012-0129152 filed on Nov. 14, 2012, which is incorporated herein by reference in its entirety.

BACKGROUND

Field of the Disclosure

The present disclosure relates to a display panel with a bezel area of a reduced width. Especially, the present disclosure relates to a display panel having a non-display areas extending along a plane different from a plane along which a flat display area extends.

Discussion of the Related Art

Nowadays, various flat panel display devices are available to overcome many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

With light weight and thin thickness, the panel type display can be applied to the display images for mobile communication devices and/or portable/personal information devices. Nowadays, for the portable or mobile applications, the requirement for the thinner, lighter and having lower power consumption display panel is ever increasing.

An inorganic light emitting diode display device is a type of an electroluminescence display device. As a self-emitting display device, the electroluminescence display device has the advantages of a higher response speed, higher brightness and a large viewing angle. The organic light emitting diode comprises the organic light emitting material layer, and the cathode and the anode which are facing each other with the organic light emitting material layer therebetween.

The organic light emitting diode display (or OLED) using the organic light emitting diode can be divided into two types: (i) the passive matrix type organic light emitting diode display (or PMOLED) and (ii) the active matrix type organic light emitting diode display (or AMOLED). Furthermore, the OLED may be divided into two types according to the direction of the emitted light: the top emission type and the bottom emission type.

The organic light emitting diode display may be formed as a flexible display. The flexible active matrix type organic light emitting diode display (or Flexible AMOLED) shows the video data by controlling the current applying to the organic light emitting diode using the thin film transistor (or TFT).

SUMMARY

Embodiments relate to a display device with a flexible display layer configured to reduce a size of a bezel area. The display device includes a transparent cover plate and a flexible display layer secured to the transparent cover plate. The transparent cover includes a flat portion. The flexible display layer includes a display area and a non-display area. The display area includes an upper flat area extending along a first plane below the flat portion of the transparent cover plate. The non-display area extends from at least an edge of the display area and at least part of the non-display area extends along a second plane for connection to receive a signal for displaying an image on the flexible display layer. A signal line between a signal source and the non-display area transmit the signal from the signal source to the non-display area.

In one embodiment, the second plane is perpendicular to the first plane.

In one embodiment, the transparent cover plate includes side portions extending from edges of the flat portion. The side portions of the transparent cover plate in conjunction with the flat portion of the transparent cover plate define space for holding the flexible display layer.

In one embodiment, the display device further includes a frame secured to edges of the side portions of the transparent cover plate to enclose the flexible display layer between the transparent cover plate and the frame.

In one embodiment, the display area of the flexible display layer extends to at least one side surface of the display device and across at least a portion of a bottom surface of the display device.

In one embodiment, the second plane is parallel to the first plane and is separated from the second plane by a distance. The non-display area is connected to the signal line at a bottom of the display device.

In one embodiment, the display area of the flexible display layer extends at least partially to one side surface of the display device substantially perpendicular to the first plane.

In one embodiment, the display area of the flexible display layer extends to at least a side surface of the display device and at least a portion of a bottom surface of the display device.

In one embodiment, the flexible display layer includes an organic light emitting layer.

In one embodiment, the display device includes a touch panel layer between the transparent cover plate and the flexible display layer. The touch panel layer is coextensive with the flexible display layer.

In one embodiment, the touch panel layer includes a first touch panel sub-layer having horizontal touch electrode lines and a second touch panel sub-layer having vertical touch electrode line.

In one embodiment, the non-display area of the flexible display layer is not secured to the transparent cover plate.

In one embodiment, the display device further includes a polarization film between the transparent cover plate and the flexible display layer. The polarization film is coextensive with the display area of the flexible display layer.

In one embodiment, the polarization film is secured to the display area of the flexible display layer but not to the non-display area of the flexible display layer.

Embodiments also relate to a display device including a first portion and a second portion. The first portion of flexible display layer extends along a first plane. The first portion includes at least a part of a display area for displaying an image. The second portion of the flexible display layer is coupled to the first portion and extends along a second plane different from the first plane. The second portion includes at least a part of a non-display area extending from the display area for connection to receive a signal to display the image. A signal line between a signal source and the non-display area of the flexible display transmit the signal from the source to the non-display area.

BRIEF DESCRIPTION OF THE DRAWINGS

The accompanying drawings, which are included to provide a further understanding of the disclosure and are incorporated in and constitute a part of this specification, illustrate embodiments and together with the description serve to explain the principles of the embodiments.

DETAILED DESCRIPTION OF EMBODIMENTS

Figure 1A:
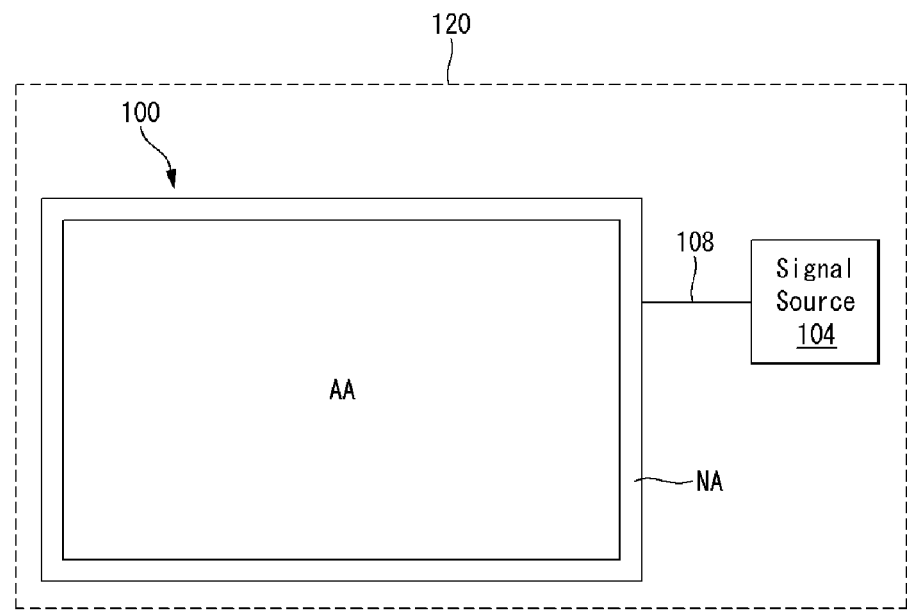
FIG. 1A is a diagram illustrating an electronic device including an organic light emitting diode (OLED) device and a signal source, according to one embodiment.

Embodiments of the present disclosure are described below with reference to Figures. Like reference numerals designate like elements throughout the detailed description. However, the present disclosure is not restricted to these embodiments and various changes or modifications can be made. In the following embodiments, the names of the elements are selected for ease of explanation.

FIG. 1A is a block diagram illustrating an electronic device 120 including an organic light emitting diode (OLED) device 100 and a signal source 104, according to one embodiment. The signal source 104 generates and sends electrical signals to the OLED 100 via a signal line 108. The signal source 104 may be embodied as an integrated circuit (IC) for processing electronic signals.

The electric signals are received at non-display area NA of the OLED 100. The signals received at the non-display area NA of the OLED 100 are processed and forwarded directly or forwarded directly without further processing to display area AA of the OLED 100.

The electronic device 120 may include, but is not limited to mobile electronic devices such as smartphones.

Figure 1B:
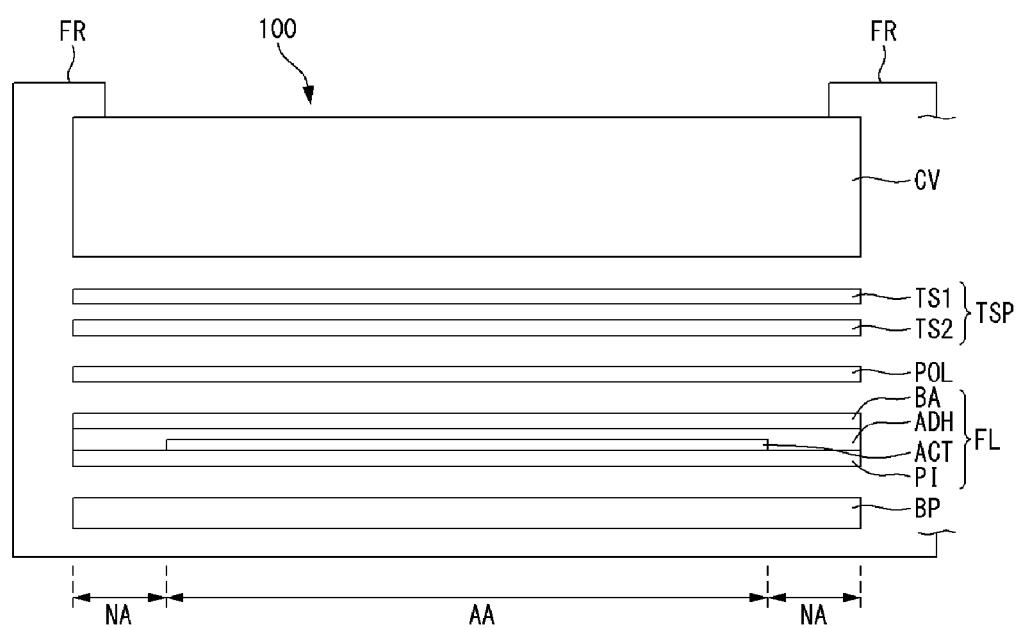
FIG. 1B is a cross sectional view illustrating the structure of an OLED device mounted using a frame, according to one embodiment.

FIG. 1B is a cross sectional view of an example organic light emitting diode (OLED) device 100. The OLED 100 may include, for example, an organic light emitting layer FL, a back panel BP below the organic light emitting layer FL, a polarization film POL on the organic light emitting layer FL, a film type touch panel (or "touch film" or "touch panel film") TSP placed over the polarization film POL, and a cover plate CV placed on the touch panel film TSP.

The back panel BP affords rigidity and strength to the OLED device 100. The back panel BP may also include traces or conductive lines for transmitting signals to or from the signal line 108. It is to be noted that the back panel BP is not necessarily placed at the "back" side of an OLED device, as described below in detail with reference to FIGS. 7 through 13. The back plate may, for example, be surrounded by other components of the OLED device. To decrease the overall thickness of the OLED device 100, it is advantageous to use a thin back panel BP.

The organic light emitting layer FL is used for generating images by operating OLEDs formed in pixel regions of the layer FL. The OLED layer FL may include, among other components, a substrate and a plurality of layers (e.g., an emissive layer (EML), and electrodes) formed on the substrate. FIG. 1B illustrates an organic light emitting layer FL including a flexible base layer (substrate), a display element layer ACT, and a protecting layer BA attached onto the display element layer ACT by an adhesive layer ADH for protection.

The display element layer ACT may be structured differently depending on the type of OLED implemented. For example, the display element layer ACT may be implemented as a single layer device that typically includes, an anode layer, an EML and a cathode layer formed on the substrate (i.e., a base layer). Alternatively, the display element layer ACT may be implemented as a triple-layer bottom-emitting OLED that typically includes an anode layer, a hole transport layer (HTL), an emissive layer (EML), an electron transport layer (ETL) and cathode layers formed on a substrate (i.e., a base layer). In order to decrease the thickness of the OLED device, the base layer may be as thin as 0.5 mm.

The organic light emitting layer FL is divided into a display area AA and a non-display area NA surrounding the display area AA. The display area AA refers to an area of the organic light emitting layer FL formed with thin film transistors (TFTs) and OLEDs. Based on the signals transmitted via the non-display area NA, the display area AA generates images on its surface by operating the TFTs and OLEDs. The non-display area NA refers to the remaining area of the organic light emitting layer FL including components (e.g., wires and circuits) for receiving signals for operating TFTs and OLEDs in the display area AA.

Additional film elements for supporting the display function may be formed on the organic light emitting layer FL. For example, a polarization film POL may be provided to prevent reflected surrounding light from interfering with the generated display images. As another example, a film type touch panel TSP for receiving user input may be attached to the organic light emitting layer FL. The touch film TSP may include a first touch film TS1 having a conductive line layer disposed in horizontal direction and a second touch film TS2 having a conductive line layer stacked on the organic light emitting layer FL, as illustrated in FIG. 1. The film type touch panel TSP may also include an area corresponding to a display area AA of the organic light emitting layer FL to transmit signals associated with the user's touch, and a remaining portion of the touch panel TSP corresponding to non-display area NA for processing the signals.

Furthermore, at the top of the OLED device 100, a cover plate CV may be placed to protect other elements disposed between the cover plate CV and the back panel BP. Using a frame FR, for example, the OLED device 100 may be installed in the electronic device. As illustrated in FIG. 1, portions of the frame FR may partially cover the top side portions of the OLED device 100. The top side portions of the OLED device 100 are often referred to as a bezel area where circuits or wires for operating the pixels in the organic light emitting layer FL are placed. The bezel area may include, among others, the non-display area NA of the organic light emitting layer FL.

In order to provide a larger display area on the same limited surface, it is advantageous to reduce the size of the bezel area. Especially, on mobile electronic devices, the increase in a display area of the OLED device by reducing the bezel area becomes more prominent. Embodiments described herein uses flexible characteristics of OLED devices to form a non-display area NA in a plane separated from or forming an angle with respect to another plane along which a top flat area of the organic light emitting layer FL extends.

Figure 2:
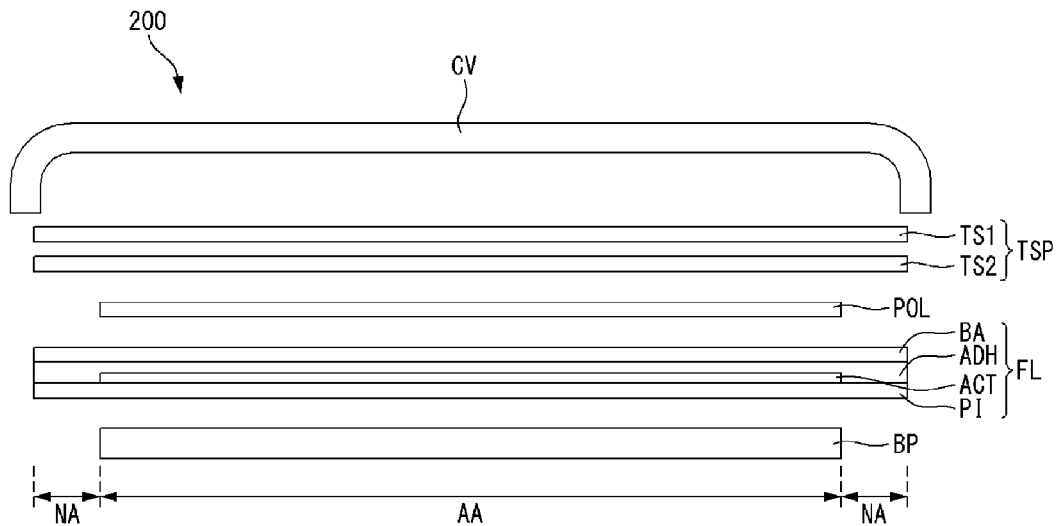
FIG. 2 is a cross sectional view illustrating a structure of a thin OLED device having an add-on type touch film, according to one embodiment.
Figure 3:
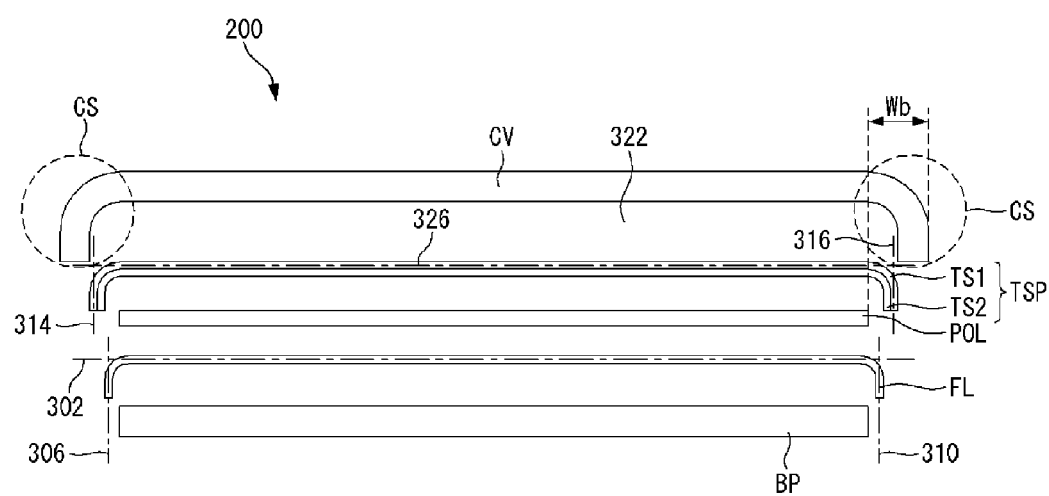
FIG. 3 is a cross sectional view illustrating components of the thin OLED device of FIG. 2 bent downwards to reduce its bezel width, according to one embodiment.

FIG. 2 is a cross sectional view illustrating a structure of a thin OLED device 200 having an add-on type touch film TSP, according to one embodiment. FIG. 3 is a cross sectional view illustrating some components of the thin OLED device 200 bent downwards to reduce its bezel width, according to one embodiment.

The OLED device 200 has substantially the same components as the OLED device 100, as described above with reference to FIG. 1. The OLED device 200 is different from the OLED device 100 in that the touch panel film TSP and the organic light emitting layer FL extend beyond the polarization film POL and the back panel BP at both sides. Furthermore, the cover plate CV has curved sides CS that are curved downwards from a top portion TS. The top portion TS and the curved sides CS define an interior 322 for accommodating other components of the OLED device 200.

The non-display area NA of the organic light emitting layer FL and both sides of the touch panel film TSP extending beyond other components are bent downward as illustrated in FIG. 3. The display area AA of the organic light emitting layer FL extends along plane 302. The non-display areas NA of the organic light emitting layer FL at both sides of the display area AA are bent vertically and extend along planes 306, 310, respectively. Similarly, the top portion of the touch panel film TSP extends along plane 326 whereas the sides of the touch panel film TSP extend along planes 314, 316.

The minimum bending radius (or "minimum radius of curvature") that a thin film may take without damage due to bending can be expressed in the following equation:

$$\varepsilon_f = \frac{d}{2r} \quad (1)$$

where $\varepsilon_f$ refers to the failure strain of the material of the thin film, "d" refers to the thickness of the thin film, and "r" refers to the radius of curvature of the thin film. In the case of the thin film used in OLED device, $\varepsilon_f$ may be 0.1 to 1%. Taking an example where the organic light emitting layer FL has a thickness of 0.1 mm, the minimum bending radius at which the organic light emitting layer FL may bend without suffering damage to the film is 0.5 to 5 mm, according to equation (1). Taking the same assumption of $\varepsilon_f$ for the touch panel film TSP, the combined thickness of the first touch film TS1 and the second touch film TS2 is 0.1 mm, and hence, the minimum bending radius of the touch panel film TSP is 0.5 to 5 mm. In such structure, the minimum width Wb of the bezel area at one side of the OLED device 200 corresponds to the sum of minimum radius of the touch panel film TSP (at the outer top surface) and the thickness of the cover plate CV at the curved sides.

Therefore, the non-display area NA of the organic light emitting layer FL and the touch panel film TSP can be bent downward with the bezel width of 1 to 10 mm from the edge of the back panel BP. Especially, by forming an adhesive layer for attaching the cover plate CV with the touch film TSP and another adhesive layer for attaching the touch film TSP with the polarization film POL only on the display area AA of the organic light emitting layer FL, the non-display area NA of the organic light emitting layer FL and the touch panel film TSP may be bent downward without being affected by the adhesive layer.

Furthermore, by attaching the end surface of the curved side portions CS of the cover plate CV with the frame (not shown in figures), only the curved side portions CS of the cover plate CV is externally visible to a user from the front of the panel. Therefore, virtually no bezel area is visible to the user, and the so-called bazeless or non-bezel display can be achieved.

Figure 4:
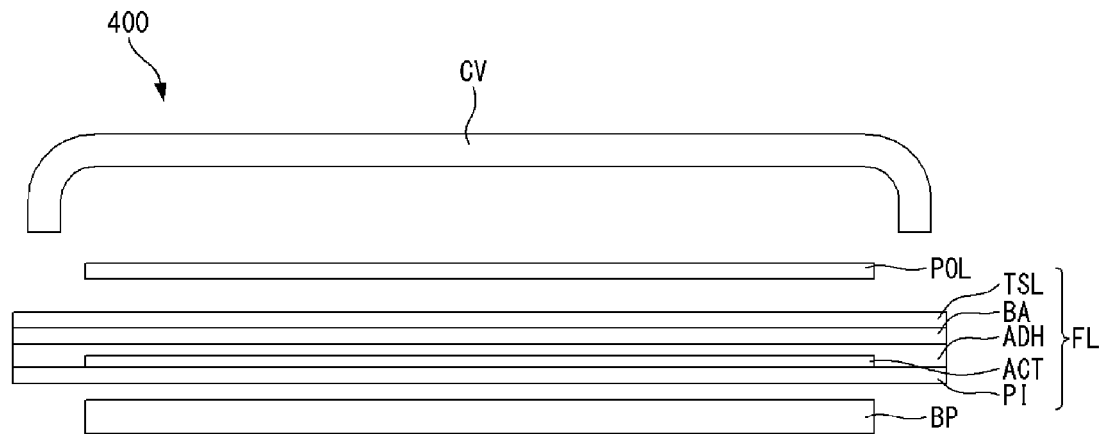
FIG. 4 is a cross sectional view illustrating a thin OLED device having an on-cell type touch film, according to one embodiment.

FIG. 4 is a cross sectional view illustrating a thin OLED device 400 having an on-cell type touch film TSL according to one embodiment. The thin OLED device 400 is substantially the same as the thin OLED device 200 except that the touch layer (or "touch screen layer") TSL is formed on the organic light emitting layer FL (and hence, referred to as on-cell type touch film TSL). The touch layer TSL may include a first touch layer having a conductive line layer extending in a horizontal direction, and a second touch layer having a conductive line layer extending in a vertical direction.

As the touch layer TSL is formed directly on the organic light emitting layer FL, a separate touch film TSP of the OLED device 200 may be obviated. The thickness of the organic light emitting layer FL having the touch layer TSL of the OLED device 400 may be substantially the same as the thickness of the OLED device 200. Assuming that the thickness of the organic light emitting layer FL is 1 mm, the minimum bending radius of 2.5 to 5 mm can be obtained according to equation (1).

Figure 5:
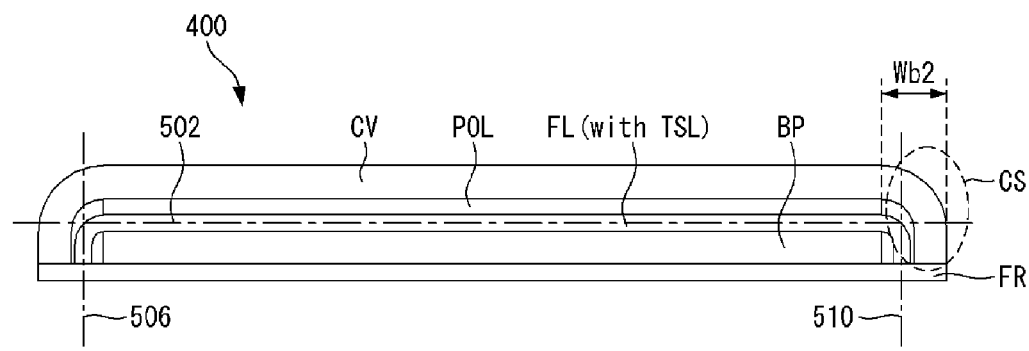
FIG. 5 is a cross sectional view illustrating an assembled version of the OLED device of FIG. 4, according to one embodiment.

FIG. 5 is a cross sectional view illustrating an assembled version of the OLED device of FIG. 4, according to one embodiment. As illustrated in FIG. 5, the organic light emitting layer FL has a top portion that extends along plane 502, a side portion extending along plane 506 and another side portion extending along plane 510. In the embodiment of FIG. 5, the plane 502 forms 90 degree angle with respect to the planes 506 and 510.

The OLED device 400 does not have a separate touch panel film TSP (as in the case of the OLED device 200). The minimum width $W_{b2}$ of the bezel area at one side of the OLED device 400 corresponds to the sum of the minimum radius of the organic light emitting layer FL (at the outer top surface) and the thickness of the cover plate CV at the curved sides.

An adhesive layer for attaching the polarization film POL on the organic light emitting layer FL having the touch layer TSL or for attaching the cover plate CV to the polarization film POL may be added to securely bond the components. In one embodiment, the adhesive layer is disposed to secure areas of the components covering only the display area AA. In this way, the non-display area AA of the organic light emitting layer FL (with the touch layer TSL) can be bent downward as illustrated in FIG. 5.

The OLED device 400 of FIG. 5 further includes a frame FR forming the bottom casing. The size of the frame FR may have the same length and width as the cover plate CV so that the edge surfaces of the curved sides CS of the cover plate CV can be attached to the upper surface of the frame FR. In such structure, only the curved side portions CS of the cover plate CV and part of the non-display (NR) area corresponding to the bezel width $W_{d2}$ are visible to the user from the front.

Figure 6:
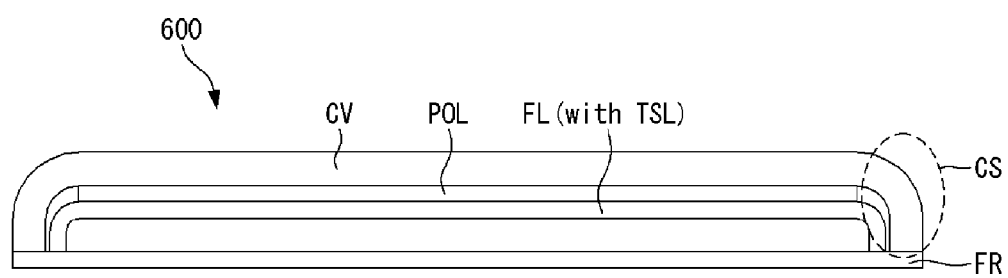
FIG. 6 is a cross sectional view illustrating an OLED device without a back panel, according to one embodiment.

FIG. 6 is a cross sectional view illustrating an OLED device without a back panel, according to one embodiment. The OLED device 600 of in FIG. 6 does not include any back panel. Instead, the organic light emitting layer FL (with the touch layer TSL) can be secured to the polarization film POL, which is in turn secured to the cover plate CV. Other than obviating the back panel, the structure of the OLED device 600 is substantially the same as the OLED device 400. Even though the back panel is removed, the bent non-display NA area can be closely in contact with the inner surface of the curved side portions CS of the cover plate CV because the organic light emitting layer FL and/or the touch panel film TSP are sufficiently elastic.

In other embodiments, instead of using a cover plate with curved sides as described above with reference to FIGS. 2-6, a flat cover plate may be used in conjunction with a frame, as illustrated in FIG. 1. The flat cover plate in such embodiment may be placed on top of a touch panel film TSP or an organic light emitting layer FL that extends beyond the flat cover plate. The frame securely clamps both sides of the touch panel film TSP, the organic light emitting layer FL and the flat cover plate.

Figure 7:
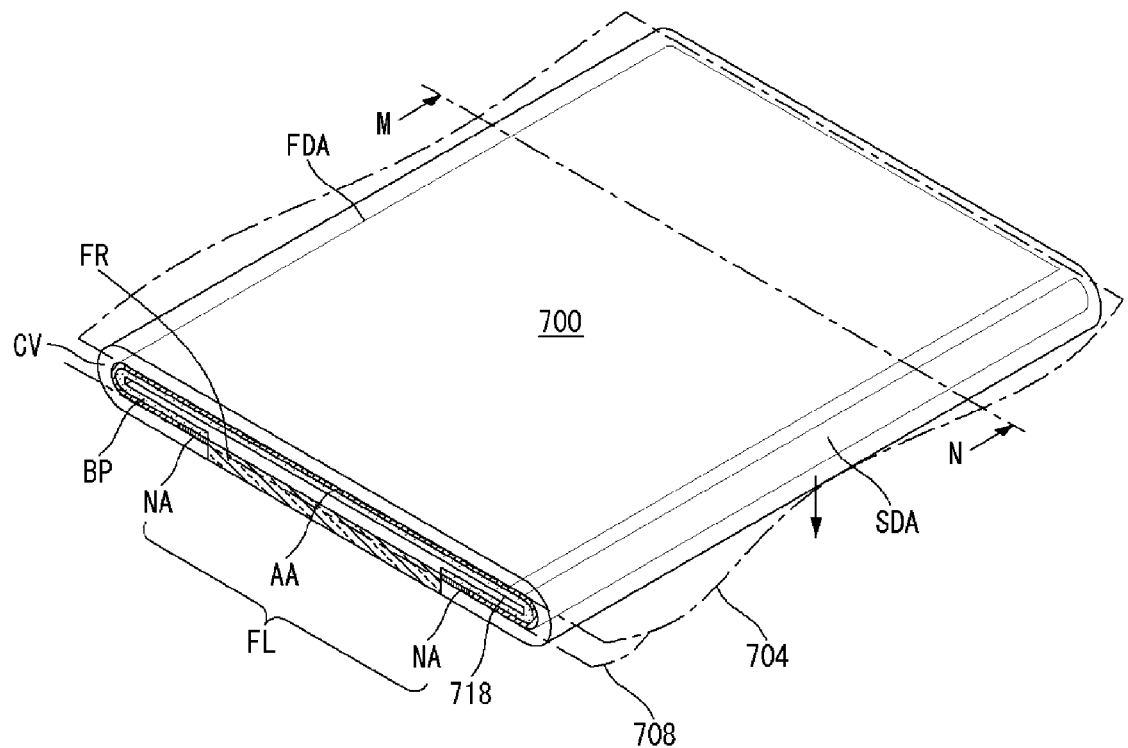
FIG. 7 is a perspective view of an OLED device with a display area extending across an upper surface and lateral sides of an electronic device, according to one embodiment.

FIG. 7 is a perspective view of an OLED device 700 with a display area AA extending across an upper surface and lateral sides of an electronic device, according to one embodiment. The OLED device 700 may include, among other components, a back panel BP, the organic light emitting layer FL placed on the back panel BP, a frame FR and a cover plate CV. The cover plate CV are placed on the organic light emitting layer FL to cover at least the display area AA of the organic light emitting layer FL. The frame FR may form a part of the bottom of the OLED 700. A cavity 718 may be formed in the middle of the back plate BP to house other components of the electronic device such as circuits (not shown).

The OLED device 700 has a display area AA that extends not only across the upper part of the OLED device 700 but also across the side and bottom parts of the OLED device 700. In this way, images can be displayed not only through the top surface of the OLED device 700 but also through side surfaces and a part of the bottom surface of the OLED device 700.

Figure 8:
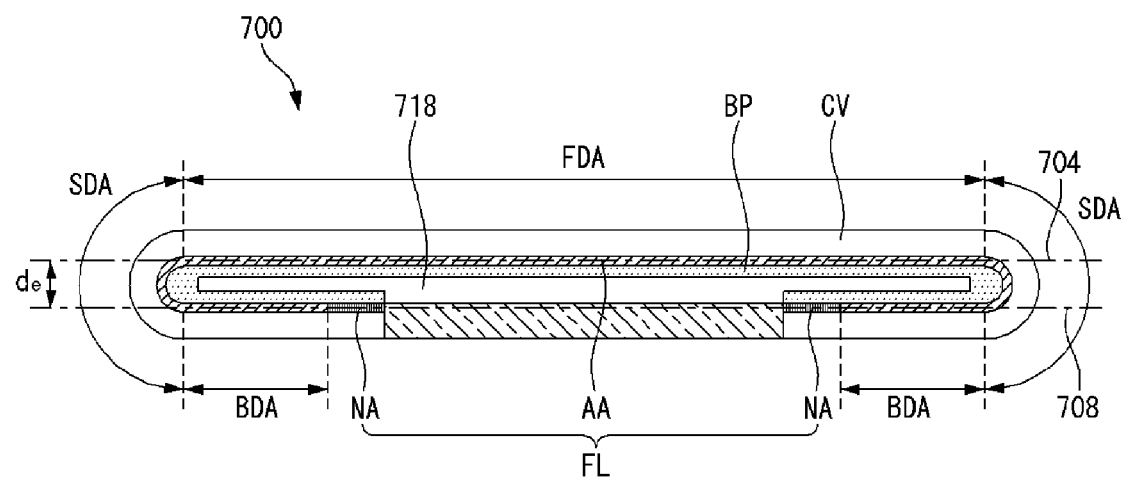
FIG. 8 is a cross-sectional view of the OLED device taken along line M-N of FIG. 7, according to one embodiment.

FIG. 8 is a cross-sectional view of the OLED device 700 taken along line M-N of FIG. 7, according to one embodiment. The display area AA of the organic light emitting layer FL consists of an upper flat area FDA extending along plane 704, lower display areas BDA extending along plane 708 and side display areas SDA connecting the upper flat area FDA and the lower display areas BDA. The plane 708 is parallel to the plane 704 and is separated by distance $d_e$. The organic light emitting layer FL is flexible, and hence, can be bent to embody the upper flat area FDA, the side display areas SDA, and the lower display areas BDA. Specifically, the side display areas SDA are bent 180 degrees, and connect the upper flat area FDA and the lower display areas BDA. Then bent organic light emitting layer FL can be secured to the back plate BP and/or to the cover plate CV to maintain its configuration.

Non-display areas NA of the organic light emitting layer FL extends from the bottom display areas BDA along the plane 708, as illustrated in FIG. 8. Non-display areas NA of the organic light emitting layer FL may then be connected to wires or circuits to provide signals to the display area AA of the organic light emitting layer FL. Because the top surface of the OLED device 700 does not include the non-display areas NA, no bezel is visible to the user from the front of the OLED device 700.

Although the OLED device 700 of FIGS. 7 and 8 include the lower display areas BDA, in other embodiments, the display area AA may include only upper flat area FDA and side display areas SDA but not lower display areas BDA. In such embodiments, the non-display areas NA of the organic light emitting layer FL may extend inwards from the side display areas SDA along the plane 708. Also, in yet other embodiments, only one side of the OLED device may have a display area SDA but not on the other side of the OLED device. On the side without the side display area SDA, the non-display area may bent vertically downwards for connection to wires of circuits to embody a bazeless display device.

Figure 9:
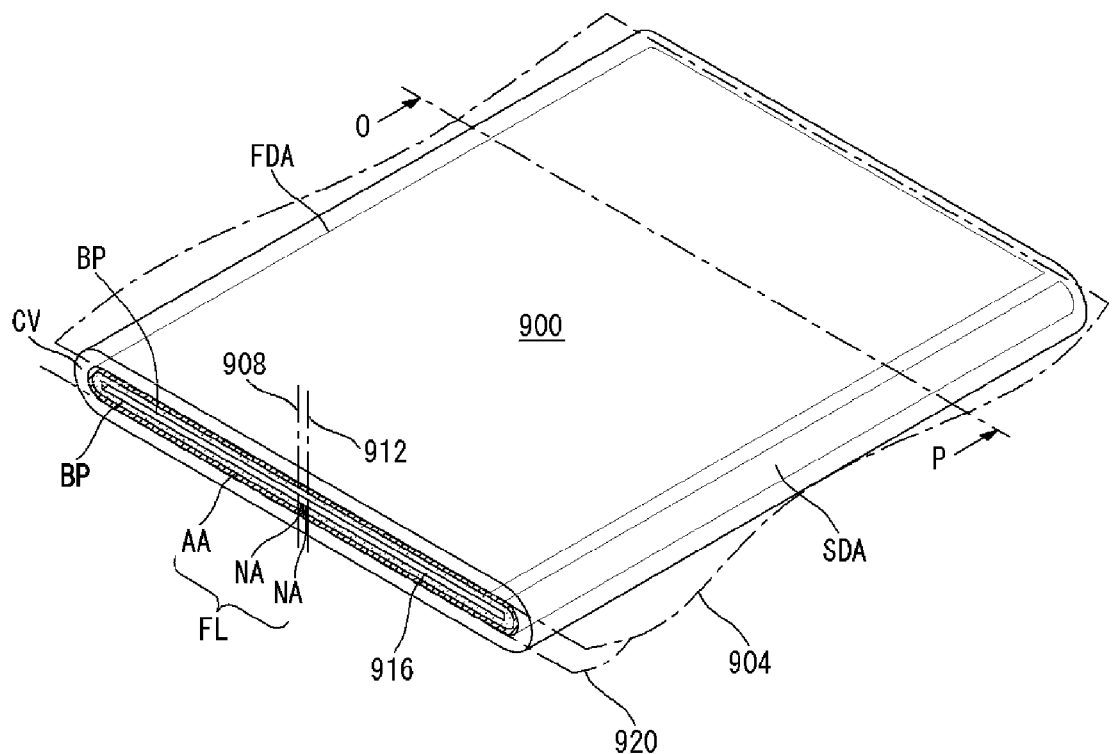
FIG. 9 is a perspective view of an OLED device with a display area extending across an entire upper surface, a substantially entire bottom surface and lateral sides, according to one embodiment.

FIG. 9 is a perspective view of an OLED device 900 with a display area AA extending across an entire upper surface, lateral sides and a substantially entire bottom surface, according to one embodiment. The OLED device 900 may include, among other components, a back panel BP, the organic light emitting layer FL placed on the back panel BP, and a cover plate CV. The cover plate CV are placed on the organic light emitting layer to cover the entire output surface of the organic light emitting layer FL, which forms the display area AA. A cavity 916 may be formed in the middle of the back plate BP to house other components of the electronic device such as circuits (not shown).

The OLED device 900 has a display area AA that extends not only across the upper part of the OLED device 900 but also across the entire side and bottom parts of the OLED device 900. In this way, images can be displayed not only through the top surface of the OLED device 900 but also through side surfaces and the bottom surface of the OLED device 700. The OLED device 900 may constitute an outer casing of a mobile device or other electronic devices.

Figure 10:
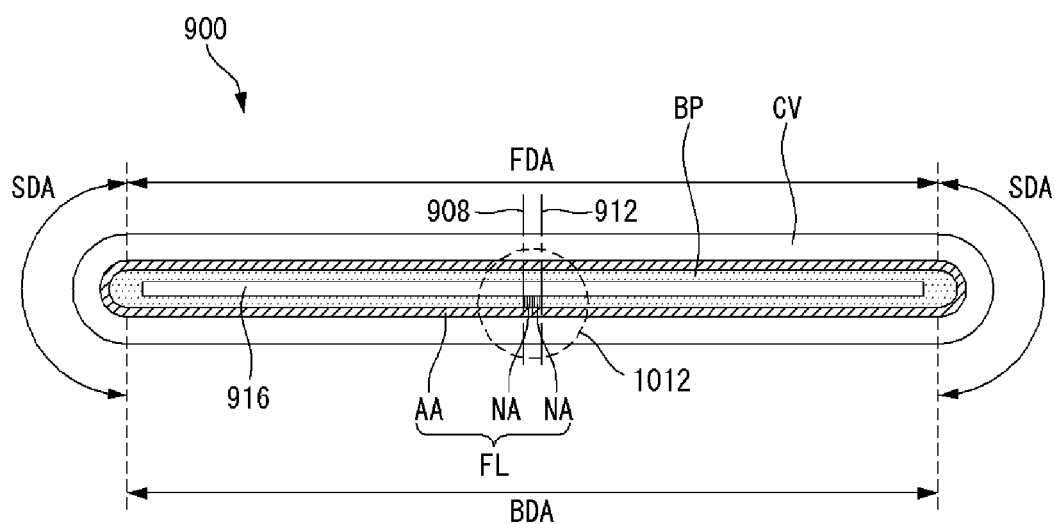
FIG. 10 is a cross-sectional view of the OLED device taken along line O-P of FIG. 9, according to one embodiment.

FIG. 10 is a cross-sectional view of the OLED device 900 taken along line O-P of FIG. 9, according to one embodiment. The display area AA of the organic light emitting layer FL consists of an upper flat area FDA extending along plane 904, lower display areas BDA extending along plane 920 and side display areas SDA connecting the upper flat area FDA and the lower display areas BDA. The organic light emitting layer FL is flexible, and hence, can be bent to embody the upper flat area FDA, the side display areas SDA, and the lower display areas BDA. Then bent organic light emitting layer FL can be secured to the back plate BP and/or to the cover plate CV to maintain its configuration. The non-display areas NA of the organic light emitting layer FL.

Figure 11:
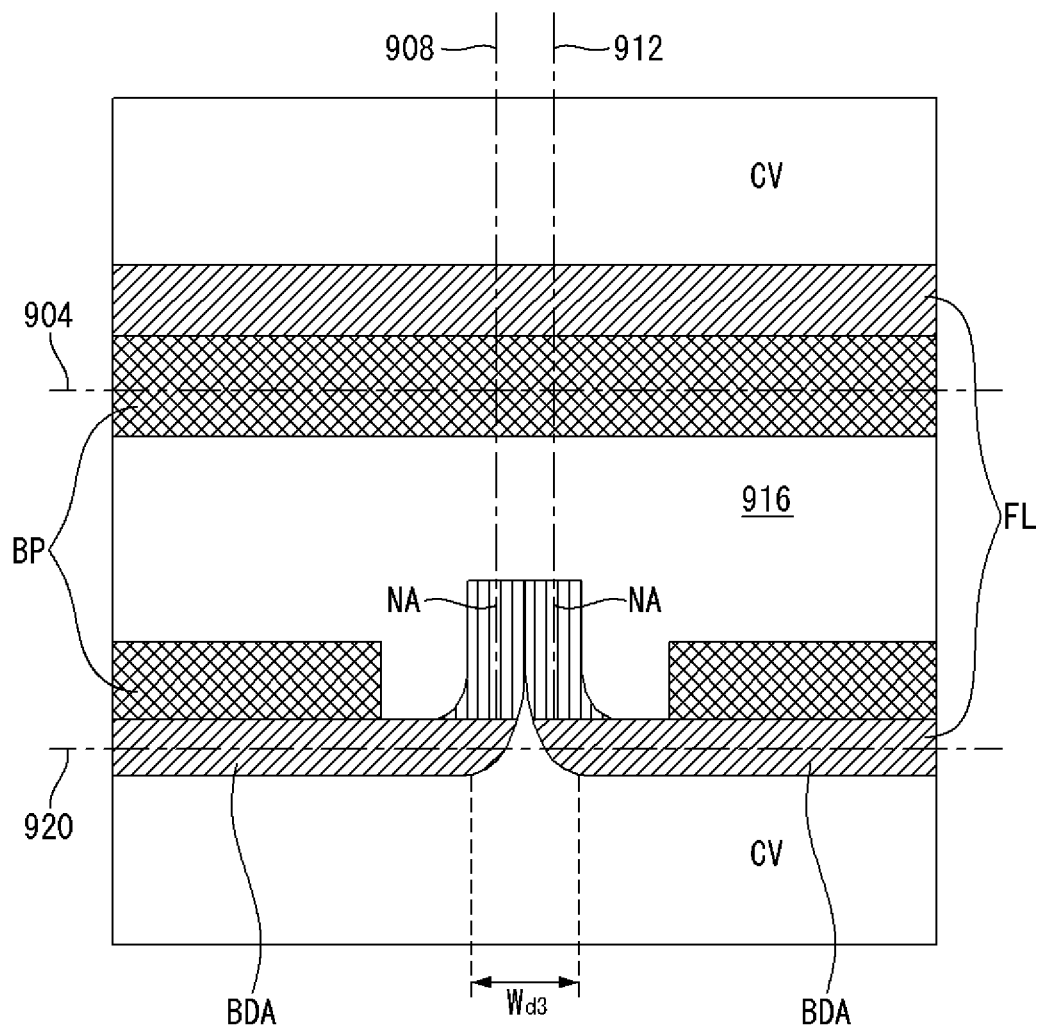
FIG. 11 is an enlarged view of a section of the OLED device in FIG. 10, according to one embodiment.

FIG. 11 is an enlarged view of a section 1012 of the OLED device 900 in FIG. 10, according to one embodiment. As shown in FIG. 11, the non-display areas NA extending from the lower display areas BDA are bent upwards at the middle of the OLED device 900. One non-display area NA extends vertically along plane 908 while the other non-display area NA extends vertically along plane 912. The minimum bending radius of the organic light emitting layer FL causes a small bezel of width $W_{d3}$ to be present in middle region where the non-display areas NA meet.

In the OLED device 900, the non-display areas NA meet (and hence form a bezel area) at the bottom center of the OLED device 900. In other embodiments, the two non-display areas NA may meet at locations other than the middle of the OLED device 900. That is, the non-display areas NA may meet at a location shifted to the left or right side from the middle portion as shown in FIG. 10.

By taking advantage of the flexible properties of the organic light emitting layer FL, the plane along which the non-display area of the organic light emitting layer FL extends may be set to be different from a plane along with an upper display area of the organic light emitting layer FL extends. In this way, the width of bezel area can be reduced or be virtually eliminated to increase the display area of the OLED device.

While the embodiment of the present disclosure has been described in detail with reference to the drawings, the embodiments can be implemented in other specific forms without changing the technical spirit or essential features of the disclosure. Therefore, it should be noted that the forgoing embodiments are merely illustrative in all aspects and are not to be construed as limiting the embodiments.

What is claimed is:

1. A display device comprising:
    a first portion of a flexible display layer extending along a first plane, the first portion comprising at least a first part of a display area for displaying an image;
    a pair of second portions of the flexible display layer extending along a second plane different from the first plane, the second portions comprising second parts of the display area and at least non-display areas extending from the second parts of the display area for connection to receive a signal to display the image;
    a third portion of the flexible display layer between one edge of the first portion and one of the second portions, the third portion including a third part of the display area, wherein the third portion is bent;
    a fourth portion of the flexible display layer between another edge of the first portion and another of the second portions, the fourth portion including a fourth part of the display area, wherein the fourth portion is bent;
    a signal line between a signal source and the non-display area of the flexible display to transmit the signal from the source to the non-display area; and
    a transparent cover plate including:
        a first flat part supporting the first portion of the flexible display layer,
        a first side part extending from an edge of the first flat part and supporting the third portion of the flexible display layer,
        a second side part extending from another edge of the first part and supporting the fourth portion of the flexible display layer,
        a second flat part extending from the first side part and supporting one of the second portions of the flexible display layer, and
        a third flat part extending from the second side part and supporting the other of the second portions of the flexible display layer, the first and second side parts in conjunction with the first flat part, the second flat part and the third flat part defining space for holding the flexible display layer; and
    a frame between an edge of the second flat part and an edge of the third flat part facing the edge of the second flat part.

2. The display device of claim 1, wherein the first portion of the flexible display layer covers a top surface of an electronic device.

3. The display device of claim 1, wherein the second plane is parallel to the first plane and separated from the first plane by a distance.

4. The display device of claim 1, wherein the flexible display layer comprises an organic light emitting layer.

5. The display device of claim 1, further comprising a touch panel layer between the transparent cover plate and the flexible display layer, the touch panel layer coextensive with the display area of the flexible display layer.

6. The display device of claim 5, wherein the touch panel layer comprises:
    a first touch panel sub-layer having horizontal touch electrode lines; and
    a second touch panel sub-layer having vertical touch electrode line.

7. The display device of claim 1, wherein the non-display area of the flexible display layer is not secured to the transparent cover plate.

8. The display device of claim 1, further comprising a polarization film between the transparent cover plate and the flexible display layer, the polarization film coextensive with the display area of the flexible display layer.

9. The display device of claim 8, wherein the polarization film is secured to the display area of the flexible display layer but not to the non-display area of the flexible display layer.

10. A display device comprising:
    a first portion of a flexible display layer extending along a first plane, the first portion comprising at least a first part of a display area for displaying an image;
    a pair of second portions of the flexible display layer extending along a second plane different from the first plane, the second portions comprising second parts of the display area and at least non-display areas extending from the second parts of the display area for connection to receive a signal to display the image;
    a third portion of the flexible display layer between one edge of the first portion and one of the second portions, the third portion including a third part of the display area, wherein the third portion is bent;
    a fourth portion of the flexible display layer between another edge of the first portion and another of the second portions, the fourth portion including a fourth part of the display area, wherein the fourth portion is bent; and
    a signal line between a signal source and the non-display area of the flexible display to transmit the signal from the source to the non-display area,
    wherein the second portion of the flexible display layer covers a bottom surface of the display device, and wherein at least part of the non-display area of the second portions of the flexible display layer extending from the second part of the display area is bent inward towards the first portion of the flexible display layer.

11. The display device of claim 10, wherein the non-display areas meet at a bottom center of the display device.

12. The display device of claim 1, further comprising a frame between the second flat part and a third flat part of the transparent cover plate parallel with second flat part and connected to the first flat part via another side part of the transparent cover plate, and wherein the frame is located between the second flat part and the third flat part of the transparent cover plate.

13. The display device of claim 11, further comprising a rigid back panel surrounded by the first, second and third portions to provide support for the first, second and third portions.

14. The display device of claim 1, wherein the second flat part covers the second portion of the flexible display layer and the non-display area of the second portion.

* * * * *